United States Patent
Hu et al.

(10) Patent No.: US 7,680,170 B2
(45) Date of Patent: Mar. 16, 2010

(54) COUPLING DEVICES AND METHODS FOR STACKED LASER EMITTER ARRAYS

(75) Inventors: Yongdan Hu, Tucson, AZ (US); James Harrison, Oro Valley, AZ (US)

(73) Assignee: Oclaro Photonics, Inc., San Jose, CA (US)

( * ) Notice: Subject to any disclaimer, the term of this patent is extended or adjusted under 35 U.S.C. 154(b) by 330 days.

(21) Appl. No.: 11/761,901

(22) Filed: Jun. 12, 2007

(65) Prior Publication Data

US 2007/0291813 A1    Dec. 20, 2007

Related U.S. Application Data

(60) Provisional application No. 60/849,913, filed on Oct. 5, 2006, provisional application No. 60/814,565, filed on Jun. 15, 2006.

(51) Int. Cl.
*H01S 5/00*    (2006.01)

(52) U.S. Cl. .................. 372/50.12; 372/50.23; 372/101; 372/107

(58) Field of Classification Search .............. 372/50.12, 372/50.23, 107
See application file for complete search history.

(56) References Cited

U.S. PATENT DOCUMENTS

| | | | |
|---|---|---|---|
| 4,428,647 A | 1/1984 | Sprague | |
| 4,763,975 A | 8/1988 | Seifres | |
| 5,127,068 A | 6/1992 | Baer | |
| 5,144,486 A | 9/1992 | Hart | |
| 5,168,401 A | 12/1992 | Endriz | |
| 5,230,969 A | 7/1993 | Savant et al. | |
| 5,243,619 A | 9/1993 | Albers et al. | |
| 5,365,366 A | 11/1994 | Kafka et al. | |
| 5,367,529 A | 11/1994 | Holsinger et al. | |
| 5,446,749 A | 8/1995 | Nighan et al. | |
| 5,513,201 A | 4/1996 | Yamaguchi | |
| 5,579,422 A | 11/1996 | Head et al. | |
| 5,691,989 A | 11/1997 | Rakuljic et al. | |
| 5,740,288 A | 4/1998 | Pan | |
| 5,740,292 A | 4/1998 | Strasser | |
| 5,787,107 A | 7/1998 | Leger | |
| 5,808,323 A | 9/1998 | Spaeth | |
| 5,825,551 A | 10/1998 | Clarkson | |
| 5,832,150 A | 11/1998 | Flint | |

(Continued)

FOREIGN PATENT DOCUMENTS

| | | |
|---|---|---|
| JP | 0411233857 A | 8/1999 |
| JP | 2002148491 A | 5/2002 |
| WO | WO9949343 | 3/1999 |

OTHER PUBLICATIONS

PCT International Search Report and Written Opinion for PCT/US2007/068717 Completed: Nov. 26, 2007.

(Continued)

*Primary Examiner*—Dung T Nguyen
(74) *Attorney, Agent, or Firm*—Grant Anderson LLP (57) ABSTRACT

Methods and devices for coupling the output light energy of one or more stacked laser emitter bar arrays using a beam interleaver and beam combiner to achieve high brightness and coupling efficiency. Some embodiments may include wavelength control devices and methods such as VIGs and the like.

46 Claims, 6 Drawing Sheets

U.S. PATENT DOCUMENTS

| | | | |
|---|---|---|---|
| 5,986,794 | A | 11/1999 | Krause |
| 5,999,544 | A | 12/1999 | Petersen |
| 6,044,096 | A | 3/2000 | Wolak et al. |
| 6,064,515 | A | 5/2000 | Yang |
| 6,160,664 | A | 12/2000 | Du et al. |
| 6,175,452 | B1 | 1/2001 | Ullman et al. |
| 6,185,235 | B1 | 2/2001 | Cheng et al. |
| 6,215,598 | B1 | 4/2001 | Hwu |
| 6,314,116 | B1 | 11/2001 | Wright et al. |
| 6,331,692 | B1 | 12/2001 | Krause et al. |
| 6,335,822 | B1 | 1/2002 | Toyohara |
| 6,337,873 | B1 | 1/2002 | Goering et al. |
| 6,356,380 | B1 | 3/2002 | Whitney |
| 6,356,577 | B1 | 3/2002 | Miller |
| 6,389,198 | B2 | 5/2002 | Kafka et al. |
| 6,493,148 | B1 | 12/2002 | Anikitchev |
| 6,504,858 | B2 | 1/2003 | Cheng et al. |
| 6,516,011 | B1 | 2/2003 | Treusch |
| 6,594,092 | B2 | 7/2003 | von Freyhold et al. |
| 6,600,605 | B1 | 7/2003 | Anikitchev |
| 6,768,593 | B1 | 7/2004 | Jutamulia |
| 6,771,686 | B1 | 8/2004 | Ullman et al. |
| 6,822,978 | B2 | 11/2004 | Kafka et al. |
| 6,831,778 | B2 | 12/2004 | Yang et al. |
| 6,876,784 | B2 | 4/2005 | Nikolov et al. |
| 6,882,664 | B2 | 4/2005 | Bolshtyansky et al. |
| 6,888,679 | B2 | 5/2005 | Brown |
| 6,891,876 | B2 | 5/2005 | Sutter et al. |
| 6,897,486 | B2 | 5/2005 | Loh |
| 6,898,231 | B2 | 5/2005 | Butterworth |
| 6,919,990 | B2 | 7/2005 | Anikitchev et al. |
| 6,922,288 | B2 | 7/2005 | Yamanaka et al. |
| 6,922,419 | B1 | 7/2005 | Nighan et al. |
| 6,931,037 | B2 | 8/2005 | Nighan et al. |
| 6,969,206 | B2 | 11/2005 | Iwanaga et al. |
| 6,977,769 | B2 | 12/2005 | Matsushita et al. |
| 6,985,648 | B2 * | 1/2006 | Kish et al. ............. 385/14 |
| 6,993,059 | B2 | 1/2006 | Anikitchev et al. |
| 7,006,194 | B2 | 2/2006 | Sumiyoshi et al. |
| 7,006,549 | B2 * | 2/2006 | Anikitchev et al. ......... 372/97 |
| 7,010,194 | B2 | 3/2006 | Anikitchev et al. |
| 7,065,105 | B2 | 6/2006 | Ehlers et al. |
| 7,244,965 | B2 | 7/2007 | Andrews et al. |
| 7,259,907 | B2 | 8/2007 | Langhans |
| 2003/0161357 | A1 | 8/2003 | Bolshtyansky et al. |
| 2004/0252744 | A1 | 12/2004 | Anikitchev et al. |
| 2004/0258117 | A1 | 12/2004 | Nebel et al. |
| 2005/0018743 | A1 | 1/2005 | Volodin et al. |
| 2005/0069255 | A1 | 3/2005 | Nishimura et al. |
| 2005/0207454 | A1 | 9/2005 | Starodoumov et al. |
| 2005/0248819 | A1 | 11/2005 | Hymel et al. |
| 2005/0248820 | A1 | 11/2005 | Moser et al. |
| 2006/0039418 | A1 | 2/2006 | Anikitchev et al. |
| 2006/0045143 | A1 | 3/2006 | Anikitchev et al. |
| 2006/0114955 | A1 | 6/2006 | Steckman |
| 2006/0126690 | A1 | 6/2006 | Kido et al. |
| 2006/0263004 | A1 | 11/2006 | Klimek et al. |
| 2006/0280209 | A1 | 12/2006 | Treusch et al. |
| 2007/0268571 | A1 | 11/2007 | Hu et al. |
| 2007/0268572 | A1 | 11/2007 | Hu et al. |
| 2007/0291373 | A1 | 12/2007 | Hu |
| 2007/0291813 | A1 | 12/2007 | Hu |
| 2008/0101429 | A1 | 5/2008 | Sipes |
| 2009/0251697 | A1 | 10/2009 | Cutillas et al. |

OTHER PUBLICATIONS

Becht, Vector phase conjuguation for beam combining in a pulsed Nd:YAG laser system, Proceedings of the SPIE—The International Society for Optical Engineering, 3263:11-19 (1998).

Fuhr, Polarization power summing in laser diode communication systems, SPIE 740:70-76 (1987).

Headley et al., Tapered Fiber bundles for combining laser pumps., Proceedings of the SPIE—The International Society for Optical Engineering, 5709(1):263-272 (200).

Knitsch et al., Diode Laser Modules of Highest Brilliance for Materials Processing, Proceedings of the SPIE, vol. 4651:256-263 (2002).

Mecherle, Laser diode combining for free space optical communication, Proceedings of the SPIE—The International Society for Optical Engineering, 616:281-291 (1986).

Miyajima et al., Single Wavelength 5.6 Direct Diode Laser with a High-Efficiency Beam Combination, Jpn. J. Appl. Phys., 43(8):5269-5272 (2004).

Moser et al., "Volume Bragg Grating Devices," Friday Morning Optical Fiber Communications Conference, 2003, OFC 2003 pp. 644-645, vol. 2, Mar. 28, 2003.

Ondax, Inc., "Volume Holographic Gratings (VHG)," 2005 pp. 1-7.

Rothenberg, Polarization beam smoothing for ineertial confinement fusion, J. Applied Physics, 87(8):3654-3662 (2000).

Sincerbox, Laser Beam Combining, IBM Technical Disclosure Bulletin, 12(10):1663-1664 (1970).

Thestrup et al, High brightness laser source based on polarization coupling of two diode lasers with asymmetric feedback, Applied Physics Letters, 82(5):680-682 (2003).

Treusch et al., High-Brightness Semiconductor Laser Sources for Materials Processing: Stacking, Beam Shaping, and Bars, IEEE Journal of Selected Topics in Quantum Electronics, 6(4):601-614 (2000).

Office Action mailed on Jan. 23, 2009 for U.S. Appl. No. 11/747,172, filed May 10, 2007 and published as 2007/0268571 A1 on Nov. 22, 2007.

Office Action mailed on Jul. 29, 2008 for U.S. Appl. No. 11/747,172, filed May 10, 2007 and published as 2007/0268571 A1 on Nov. 22, 2007.

Office Action mailed on Jul. 19, 2007 for U.S. Appl. No. 11/352,500, filed Feb. 10, 2006 and published as: US 2006/0280209 A1 on Dec. 14, 2006.

Office Action mailed on Feb. 25, 2009 for U.S. Appl. No. 11/759,885, filed Jun. 7, 2007 and published as: US 2007/0291373 A1 on Dec. 20, 2007.

Office Action mailed on Dec. 10, 2008 for U.S. Appl. No. 11/747,184, filed May 10, 2007 published as: US 2007/0268572 A1 on Nov. 22, 2007.

Andersen et al., "High Repetition Rate Tunable Femtosecond Pulses from Fiber Laser Pumped Parametric Amplifier," Advanced Solid-State Photonics, ME2, Abstract of Talk 4:30pm Jan. 30, 2006.

Brunner et al., "Powerful red-green-blue laser source pumped with a mode-locked thin disk laser," Optics Letters 29(16):1921-1923, Aug. 15, 2004.

Ghislotti et al., Bidirectional Pumping of Er-Doped Fibers Using Detuned 980-nm Lasers, IEEE Photonics Technology Letters 14(5):780-782 2002.

Kruglov et al., "Self-similar propagation of parabolic pulses in normal-dispersion fiber amplifiers," Josa B, 19(3):461-469 2002.

Office Action mailed on Jul. 8, 2009 for U.S. Appl. No.: 11/747,184 filed: May 10, 2007 published as: US 2007/0268572 A1 on Nov. 22, 2007.

Office Action mailed on Jul. 24, 2009 for U.S. Appl. No.: 11/747,172 filed: May 10, 2007 published as: US 2007/0268571 A1 on Nov. 22, 2007.

Piper et al., 1.2 mJ, 37 ns. single-moded pulses at 10kHz repetition rate from a Q-switched ytterbium fiber Laser, Abstract, in, Proceedings of CLEO/IQEC May 16-21, 2004: Conference on Lasers and Electro-Optics, Quantum Electronics and Laser Science. USA, Institute of Electrical and Electronics Engineers.

Steinmann et al., "Tunable fs Laser Pulses from Opa with MHz Repetition Rate," Advanced Solid-State Photonics, TuC6, Abstract of Talk, 12:30pm Jan. 31, 2006.

Valdor Fiber Optics Catalog #910-00001, pp. 1-2 Impact Mount Singlemode Laser Pigtails. Printed from the internet on: Dec. 22, 2006.

Volodin et al., Wavelength Stabilization and spectrum narrowing of high-power multimode laser diodes and arrays by use of vol. Bragg gratings. Optics Letters 29(16): Aug. 15, 2004.

\* cited by examiner

COUPLING DEVICES AND METHODS FOR STACKED LASER EMITTER ARRAYS

RELATED APPLICATIONS

This application claims priority under 35 U.S.C. section 119(e) from U.S. Provisional Patent application Ser. No. 60/849,913 titled "Coupling Devices and Methods for Stacked Laser Emitter Arrays", filed Oct. 5, 2006, by Hu, Y. et al. and U.S. Provisional Patent application Ser. No. 60/814, 565 titled "Diode Laser System and Method of Manufacture", filed Jun. 15, 2006, by Srinivasan, R. et al., both of which are also incorporated by reference herein in their entirety.

BACKGROUND

Applications requiring light energy and specifically laser energy may benefit from the use of solid state light sources such as laser diodes which are commonly available, reliable to operate and relatively cost effective as a laser energy source. Such devices may include a plurality of laser emitters in a single bar that emit laser light simultaneously in a common direction. In addition, multiple solid state or laser emitter bars may be disposed in a stacked configuration so as to generate even higher power levels. Typically the emitters of such solid state emitter bars are spaced from each other to allow sufficient cooling without the need for elaborate and expensive cooling systems.

Laser diode bars are often used for communication technology devices, medical applications and other applications where it is desirable to couple the output of all the emitters of a single solid state emitter bar or multiple bars in a stacked configuration into a single optical fiber or other optical conduit. The spatial distribution of the emitters of a bar or stack of solid state emitter bars can make coupling the output of multiple emitters challenging, particularly when coupling to a small diameter optical fiber.

While the use of a micro-lens array reduces the divergence angle among the longitudinally separated beams emanating from the emitters of a bar, a solid state emitter bar which incorporates several, transversely separated emitters requires that an objective lens or lenses having a large numerical aperture be used if the beam is to be concentrated into a usefully small spot. Large numerical aperture objective lenses tend to be expensive. The problem becomes even more difficult when more power is required than can be delivered by a single laser bar. If it is attempted to use two laser bars, the lateral separation of their beams adds to the difficulty.

As such, what has been needed are methods and devices for coupling the output of multiple emitters of a laser emitter bar or stacked laser emitter bar array while maintaining a high degree of brightness and coupling efficiency.

SUMMARY

Some embodiments of an optical apparatus include at least one stacked array of laser emitter bars which each have a plurality of laser emitters with a fast axis, a slow axis and an emission axis that is substantially perpendicular to the fast and slow axes. The emitters of each laser emitter bar are disposed in a substantially linear configuration along a slow axis direction of the emitters. The laser emitter bars are stacked along a fast axis direction of the emitters with the emission axes of the at least one stacked array being disposed substantially parallel to each other and with the emitters having a substantially uniform polarization orientation. A fast axis collimator is disposed adjacent to the at least one stacked array and is configured to collimate an output of the emitters of each laser emitter bar of the at least one stacked array in a fast axis direction. A beam interleaver has an input axis aligned with the output axes of the laser emitters of the at least one stacked array of laser emitter bars and is configured to translate a first output array from a plurality of laser emitter bars, a second output array from a plurality of laser emitter bars or both the first output array and second output array such that substantially fast axis collimated outputs of emitter bars of the first output array are disposed adjacent or between substantially fast axis collimated outputs of emitter bars of the second output array with the fast axes of the emitters of the first output array substantially aligned with the fast axes of the emitters of the second output array in a vertically interleaved arrangement. The optical apparatus also includes a beam combiner which has an input axis aligned with an output axis of the beam interleaver and is configured to fold the interleaved emission arrays of the first and second output arrays so as to reduce the overall beam size and increase the overall beam intensity. Focusing optics are aligned with an output axis of the beam combiner.

Some embodiments of a method of coupling light energy to an optical fiber include emitting a first output array of light energy and a second output array of light energy from at least one stacked array of laser emitter bars. The first output array and the second output array of light energy are then vertically interleaved with an interleaver. The interleaved first and second output arrays are folded with a beam combiner and an output beam of the beam combiner is focused into an input of an optical fiber.

For some of these method embodiments, folding the interleaved first and second output arrays includes passing the vertically interleaved first and second output arrays through a polarization beam combiner. Some embodiments may include passing a first portion of the vertically interleaved first and second output arrays having a first polarization orientation through a polarization altering element so as to generate a second polarization orientation. The first portion of the interleaved first and second output arrays is reflected from a first reflective surface and a second selectively reflective surface which is parallel to the first reflective surface. The second selectively reflective surface is also configured to reflect light energy having the second polarization orientation and transmit light energy having the first polarization orientation. A second portion of the interleaved first and second output arrays having the first polarization orientation is passed through the second selectively reflective surface. Some embodiments may include reflecting a first portion of the interleaved first and second output arrays having a first polarization orientation from a first reflective surface and a second selectively reflective surface which is parallel to the first reflective surface. The selectively reflective surface is also configured to reflect light energy having the first polarization orientation and transmit light energy having a second polarization orientation. A second portion of the interleaved first and second output arrays having the first polarization orientation is passed through a polarization altering element so as to generate a second polarization orientation. The second portion of the interleaved first and second output arrays is then passed through the second selectively reflective surface.

For some of these method embodiments, folding the interleaved first and second output arrays includes passing the vertically interleaved first and second output arrays through a wavelength beam combiner. Some embodiments include passing a first portion of the interleaved first and second output arrays having a first wavelength band through a wavelength control element so as to generate a second wavelength band. The first portion of the interleaved first and second output arrays is reflected from a first reflective surface and a second selectively reflective surface which is parallel to the first reflective surface. The second reflective surface is configured to reflect light energy having the second wavelength band and transmit light energy having the first wavelength band. A second portion of the interleaved first and second output arrays having the first wavelength band is passed through the second selectively reflective surface. Some embodiments include reflecting a first portion of the interleaved first and second output arrays having a first wavelength band from a first reflective surface and a second selectively reflective surface which is parallel to the first reflective surface. The second reflective surface is configured to reflect light energy having the first wavelength band and transmit light energy having a second wavelength band. A second portion of the vertically interleaved first and second output arrays having the first wavelength band is passed through a wavelength control element so as to generate a second wavelength band. The second portion of the vertically interleaved first and second output arrays is passed through the second selectively reflective surface.

Some embodiments of an optical apparatus include a first stacked array of laser emitter bars which each have a plurality of laser emitters with a fast axis, a slow axis and an emission axis that is substantially perpendicular to the fast and slow axes. The emitters of each laser emitter bar are disposed in a substantially linear configuration along a slow axis direction of the emitters and the laser emitter bars are stacked along a fast axis direction of the emitters. The optical apparatus also includes a second stacked array of laser emitter bars each having a plurality of laser emitters with a fast axis, a slow axis and an emission axis that is substantially perpendicular to the fast and slow axes. The emitters are disposed in a substantially linear configuration along a slow axis direction of the emitters and the laser emitter bars of the second stacked array are stacked along a fast axis direction of the emitters with the emission axes of the first stacked array being disposed substantially parallel to the emission axes of the second stacked array, the fast axes of the emitters of the first stacked array substantially aligned with the fast axes of the emitters of the second stacked array and the emitters of the first and second stacked arrays having a substantially uniform polarization orientation. A first fast axis collimator is configured to collimate an output of the first stacked array of laser emitter bars in a fast axis direction. A second fast axis collimator is configured to collimate an output of the second stacked array of laser emitter bars in a fast axis direction. A vertical beam interleaver has an input axis aligned with the emission axes of the laser emitters of the first and second stacked arrays and is configured to translate an emission array of the first stacked array, an emission array of the second stacked array or both the emission array of the first stacked array and emission array of the second stacked array in a fast axis direction such that substantially fast axis collimated outputs of emitter bars of the first stacked array are disposed adjacent or between substantially fast axis collimated outputs of emitter bars of the second stacked array in a vertically interleaved arrangement. For some embodiments, the first and second stacked arrays may be replaced with a first portion and a second portion of a single stacked array. A beam combiner has an input axis aligned with an output axis of the vertical beam interleaver. Focusing optics are aligned with an output axis of the beam combiner.

Some embodiments of an optical apparatus include a first stacked array of laser emitter bars which each have a plurality of laser emitters with a fast axis, a slow axis and an emission axis that is substantially perpendicular to the fast and slow axes. The emitters of each laser emitter bar are disposed in a substantially linear configuration along a slow axis direction of the emitters. The emitter bars of the first stacked array are stacked along a fast axis direction of the emitters. The apparatus also includes a second stacked array of laser emitter bars which each have a plurality of laser emitters with a fast axis, a slow axis and an emission axis that is substantially perpendicular to the fast and slow axes disposed in a substantially linear configuration along a slow axis direction of the emitters. The laser emitter bars of the second stacked array are stacked along a fast axis direction of the emitters with the emission axes of the first stacked array being disposed substantially parallel to the emission axes of the second stacked array, the slow axes of the emitters of the first stacked array substantially aligned with the slow axes of the emitters of the second stacked array with the first stacked array displaced in a fast axis direction relative to the second stacked array by about one half of the pitch of the first stacked array. The emitters of the first and second stacked arrays have a substantially uniform polarization orientation. A first fast axis collimator is configured to collimate an output of the first stacked array of laser emitter bars in a fast axis direction. A second fast axis collimator is configured to collimate an output of the second stacked array of laser emitter bars in a fast axis direction. A lateral beam interleaver has an input axis aligned with the emission axes of the laser emitters of the first and second stacked arrays and is configured to translate an emission array of the first stacked array, an emission array of the second stacked array or both the emission array of the first stacked array and the emission array of the second stacked array in the slow axis direction such that substantially fast axis collimated outputs of emitter bars of the first stacked array are disposed adjacent and between substantially fast axis collimated outputs of emitter bars of the second stacked array with the fast axes of the emitters of the first stacked array substantially aligned with the fast axes of the emitters of the second stacked array in a vertically interleaved arrangement. A beam combiner has an input axis aligned with an output axis of the lateral beam interleaver and focusing optics are aligned with an output axis of the beam combiner.

Some embodiments of an optical apparatus include a first stacked array of laser emitter bars which each have a plurality of laser emitters with a fast axis, a slow axis and an emission axis that is substantially perpendicular to the fast and slow axes. The emitters are disposed in a substantially linear configuration along a slow axis direction of the emitters and the laser emitter bars are stacked along a fast axis direction of the emitters. The apparatus also includes a second stacked array of laser emitter bars which each have a plurality of laser emitters with a fast axis, a slow axis and an emission axis that is substantially perpendicular to the fast and slow axes. The emitters are disposed in a substantially linear configuration along a slow axis direction of the emitters and the laser emitter bars of the second stacked array are stacked along a fast axis direction of the emitters with the emission axes of the first stacked array being disposed substantially parallel to the emission axes of the second stacked array and the fast axes of the emitters of the first stacked array substantially aligned with the fast axes of the emitters of the second stacked array. The emitters of the first and second stacked arrays have a substantially uniform polarization orientation. A first fast axis collimator is configured to collimate an output of the first stacked array in a fast axis direction. A second fast axis collimator is configured to collimate an output of the second stacked array in a fast axis direction. A vertical beam interleaver has an input axis aligned with the emission axes of the laser emitters of the first and second stacked arrays and is configured to translate an emission array of the first stacked array, an emission array of the second stacked array or both the emission array of the first stacked array and the emission array of the second stacked array in a fast axis direction such that substantially fast axis collimated outputs of emitter bars of the first stacked array are disposed adjacent or between substantially fast axis collimated outputs of emitter bars of the second stacked array in a vertically interleaved arrangement. For some embodiments, the first and second stacked arrays may be replaced with a first portion and a second portion of a single stacked array. A polarization beam combiner has an input axis aligned with an output axis of the vertical beam interleaver and is configured to fold the vertically interleaved emission arrays of the first and second stacked arrays in a fast axis direction so as to reduce the overall beam size and increase the overall beam intensity. Focusing optics are aligned with an output axis of the polarization beam combiner.

Some embodiments of an optical apparatus include a first stacked array of laser emitter bars with each laser emitter bar having a plurality of laser emitters with a fast axis, a slow axis and an emission axis that is substantially perpendicular to the fast and slow axes. The emitters are disposed in a substantially linear configuration along a slow axis direction of the emitters and the laser emitter bars are stacked along a fast axis direction of the emitters. The apparatus also includes a second stacked array of laser emitter bars each having a plurality of laser emitters with a fast axis, a slow axis and an emission axis that is substantially perpendicular to the fast and slow axes. The emitters of each laser emitter bar are disposed in a substantially linear configuration along a slow axis direction of the emitters. The laser emitter bars of the second stacked array are stacked along a fast axis direction of the emitters with the emission axes of the first stacked array being disposed substantially parallel to the emission axes of the second stacked array, the slow axes of the emitters of the first stacked array substantially aligned with the slow axes of the emitters of the second stacked array with the first stacked array displaced in a fast axis direction relative to the second stacked array by about one half of the pitch of the first stacked array and the emitters of the first and second stacked arrays having a substantially uniform polarization orientation. A first fast axis collimator is configured to collimate an output of the first stacked array in a fast axis direction. A second fast axis collimator is configured to collimate an output of the second stacked array in a fast axis direction. A lateral beam interleaver has an input axis aligned with the emission axes of the laser emitters of the first and second stacked arrays and is configured to translate an emission array of the first stacked array, an emission array of the second stacked array or both the emission array of the first stacked array and emission array of the second stacked array in the slow axis direction such that substantially fast axis collimated outputs of emitter bars of the first stacked array are disposed adjacent and between substantially fast axis collimated outputs of emitter bars of the second stacked array with the fast axes of the emitters of the first stacked array substantially aligned with the fast axes of the emitters of the second stacked array in a vertically interleaved arrangement. A polarization beam combiner has an input axis aligned with an output axis of the lateral beam interleaver and is configured to fold the interleaved emission arrays of the first and second stacked arrays in a slow axis direction so as to reduce the overall beam size and increase the overall beam intensity. Focusing optics are aligned with an output axis of the polarization beam combiner.

These features of embodiments will become more apparent from the following detailed description when taken in conjunction with the accompanying exemplary drawings.

DETAILED DESCRIPTION

Figure 1:
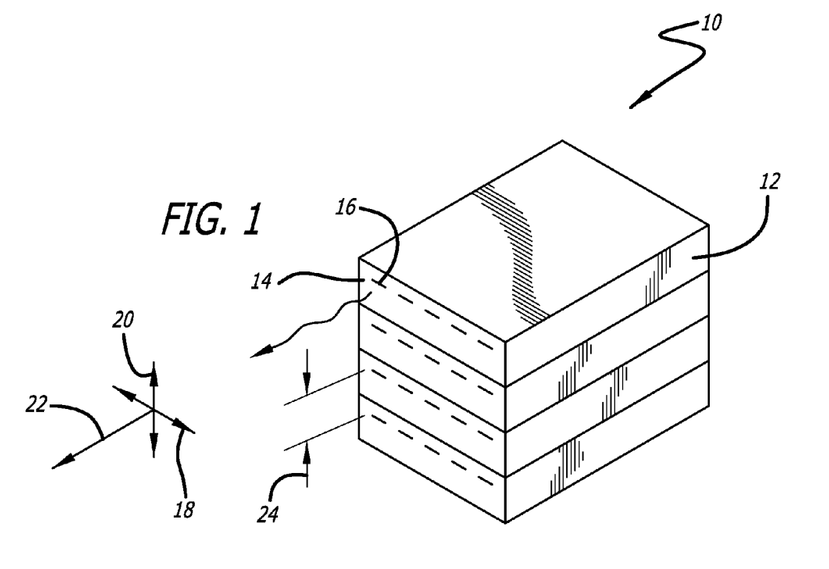
FIG. 1 is a perspective view of a stacked array of laser emitter bars.
Figure 2:
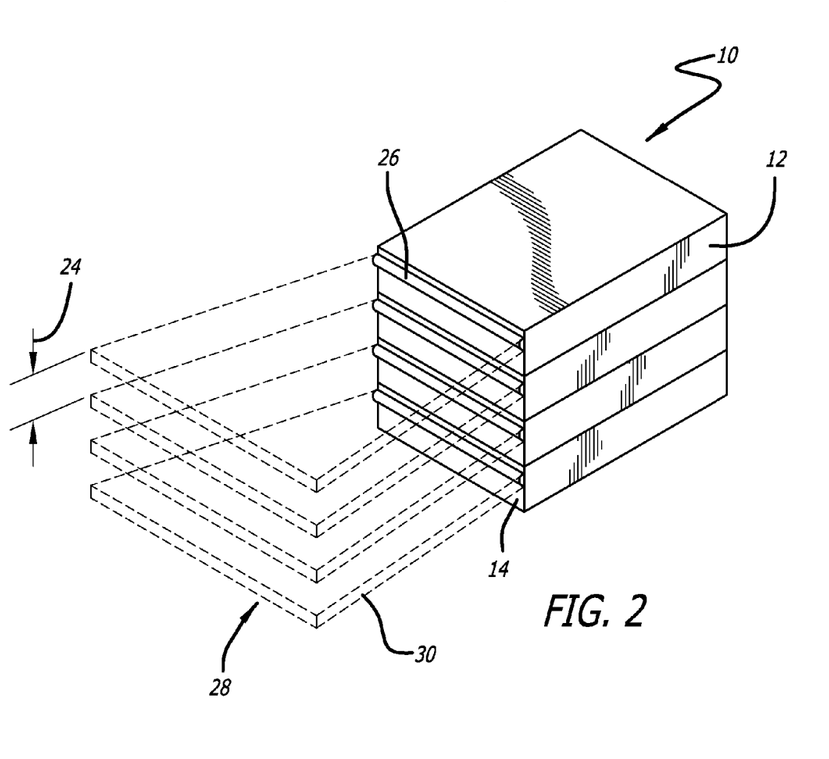
FIG. 2 show an emission array of the laser emitter bars of the stacked array of FIG. 1.

FIGS. 1 and 2 show a stacked array 10 of 4 laser emitter bars 12. Each laser emitter bar 12 has an output surface 14 that includes a total of 6 emitters 16 disposed adjacent each other. The emitters 16 are disposed in a substantially linear row along a slow axis direction of the emitters 16, as indicated by arrow 18. A fast axis direction of the emitters 16 is perpendicular to the slow axis direction 18 and is indicated by arrow 20. The emitters 16 are positioned or otherwise configured so as to emit light energy in output beams that propagate along an emission axis 22 which may be perpendicular to both the slow axis direction 18 and fast axis direction 20. The emission axes 22 of the emitters 16 of the stacked array may be substantially parallel to each other.

The laser emitter bars 12 are stacked along a fast axis direction 20 of the emitters 16 and may be stacked in a periodic and regular distribution. In the embodiment of FIG. 1, the emitters of a bottom laser emitter bar 12 are vertically separated from the emitters of an adjacent laser emitter bar 12 by a distance indicated by arrow 24 which may be referred to as the pitch of the stacked array 10. For some stacked array embodiments 10, the pitch indicated by arrow 24 may be about 1 mm to about 3 mm, specifically, about 1.5 mm to about 2.0 mm. Such a stacked array 10 of laser emitter bars 12 and emitters 16 allows more light energy or power to be produced in a relatively compact device. Laser emitter bar embodiments 12 may have any suitable number of emitters 16, such as about 2 emitters to about 100 emitters, more specifically, about 10 emitters to about 66 emitters. Some laser emitter bar embodiments 12 may include an even number of emitters 16 such as about 8, 10, 20, 38 or 48 emitters 16. For some embodiments, each laser emitter bar 12 having about 6 emitters 16 may have an output power of about 5 W to about 50 W, more specifically, about 10 W to about 20 W. Emitters 16 may include laser diodes such as edge emitting laser diodes, vertical cavity surface emitting lasers (VCSELs) and the like. Materials for the emitters 16 of the laser emitter bar 12 may include semiconductor materials such as GaAs, InP or any other suitable laser gain medium.

Generally, the emitting aperture of a laser diode embodiment of an emitter 16 is rectangular in shape with the long dimension of the emitter 16 having a size of typically tens or hundreds of microns, while the short dimension is typically one to several microns in size. Radiation emerging from an emitter 16 diverges with the divergence angle being greater along the short emitter 16 direction. Divergence angles are lower in the direction of the long emitter 16 direction. Some embodiments of the emitters 16 may have a physical width of about 50 microns to about 300 microns, a height of about 1 micron to about 3 microns, and a cavity length of about 0.5 mm to about 5 mm. Such emitter 16 embodiments may have a divergence of light energy output of about 2 degrees to about 12 degrees in the slow axis direction 18 and a divergence of light energy output of about 30 degrees to about 75 degrees in the fast axis direction 20.

Some embodiments of the laser diode bars 12 may have emitters 16 that emit light energy having a wavelength of about 700 nm to about 1500 nm, more specifically, about 800 nm to about 1000 nm. Emitters 16 may emit light having a centroid or peak wavelength of about 300 nm to about 2000 nm, more specifically, of about 600 nm to about 1000 nm, including wavelengths across the near infrared spectrum. Some particular embodiments of useful emitters may emit light at a peak wavelength of about 350 nm to about 550 nm, 600 nm to about 1350 nm or about 1450 nm to about 2000 nm. Such laser diode bars may be operated in either a pulsed mode or continuous wave mode. Frequently, the output spectral band of individual emitters 16 which are not wavelength controlled (for example wavelength controlled by providing wavelength-dependent feedback from a volume index grating or the like) may be about 0.5 nm to about 2.0 nm or more. Due to the variation in peak emission wavelength in addition to the spectral band for each individual emitter, the overall bandwidth of the laser emitter bar 12 may be about 2 nm to about 5 nm, for some embodiments. Although shown as two separate stacked arrays, the output characteristics of stacked arrays 10 and 10' may also be achieved by using different sections of a single stacked array having a similar configuration. Stacked arrays 10 and 10' each include 4 laser emitter bars 12, however, other embodiments of stacked arrays 10 and 10' may have any suitable number of laser emitter bars 12. Some stacked array 10 and 10' embodiments may have about 2 laser emitter bars 12 to about 30 laser emitter bars 12, more specifically, about 2 laser emitter bars 12 to about 10 laser emitter bars 12.

Referring to FIG. 2, stacked array 10 is shown with a fast axis collimator in the form of a cylindrical lens array 26 disposed over the emitters 16 of the stacked array 10 and configured to substantially collimate an output beam of the emitters 16 of each laser emitter bar 12 in a fast axis direction 20. Cylindrical lens array 26 may include one cylindrical lens for each laser emitter bar 12 or one or more monolithic lens arrays. This fast axis collimation produces an output array 28 as shown wherein the light energy output 30 of each laser emitter bar 12 is substantially collimated along the fast axis 20 of the emitters 16 but continues to diverge along the slow axis 18 of the emitters 16. The light energy outputs 30 of each laser emitter bar 12 have a substantially rectangular cross section transverse to the direction of propagation and are parallel to each other so as to produce the output array 28 as shown.

Figure 3:
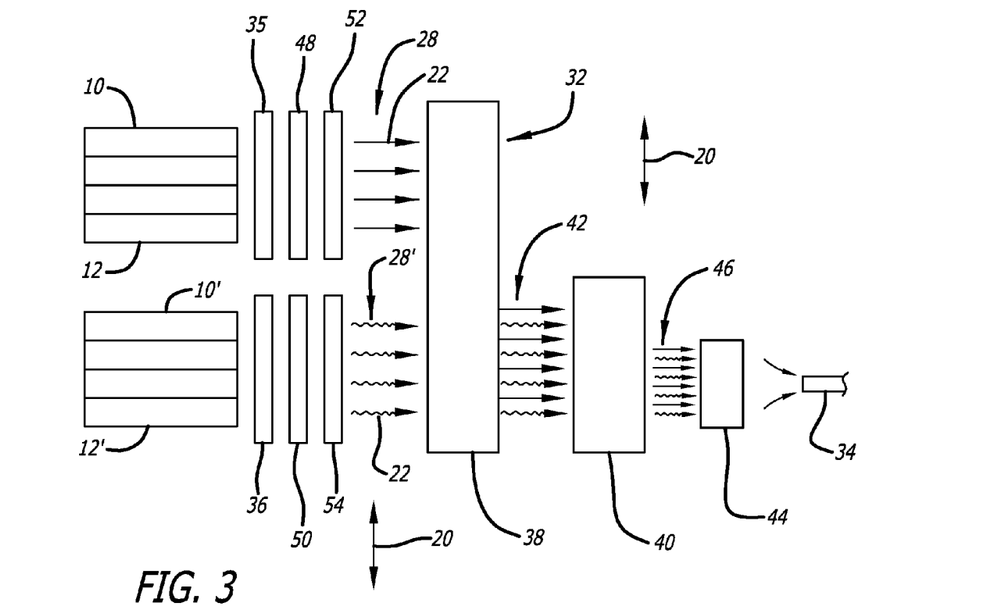
FIG. 3 is a side view of an optical apparatus for coupling the output of stacked laser emitter bar arrays including a vertical beam interleaver.
Figure 4:
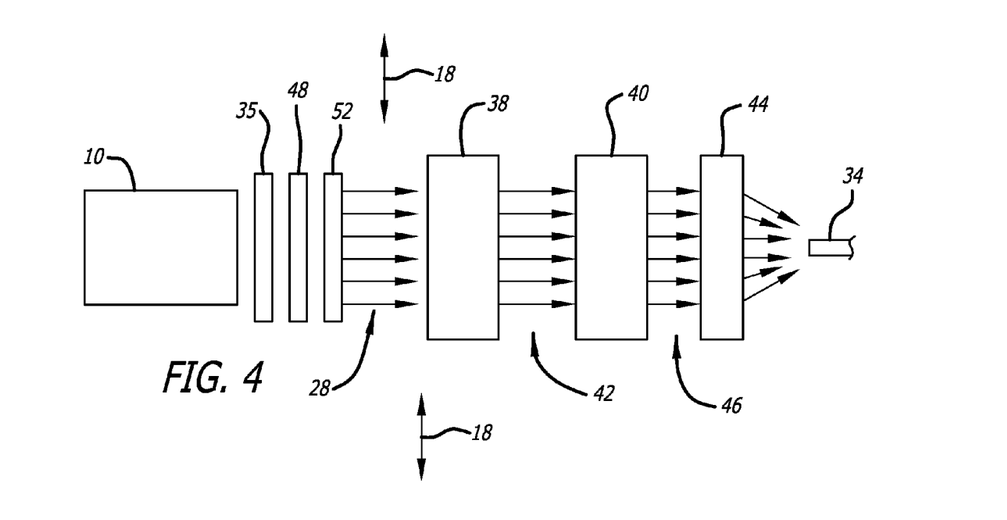
FIG. 4 is a top view of the optical apparatus of FIG. 3.

FIGS. 3 and 4 illustrate a diagrammatic view of an optical apparatus 32 for coupling light output energy of emitters 16 of laser emitter bars 12 into an optical fiber 34. The optical apparatus 32 includes a first stacked array 10 of laser emitter bars 12 which each have a plurality of laser emitters 16 (not shown) with a fast axis 20, a slow axis 18 and an emission axis 22 that is substantially perpendicular to the fast and slow axes 18 and 20 as discussed above. The emitters 16 are disposed in a substantially linear configuration along a slow axis direction 18 of the emitters 16 and the laser emitter bars 12 are stacked along a fast axis direction 20 of the emitters 16. The apparatus 32 also includes a second stacked array 10' of laser emitter bars 12 which each have 6 laser emitters 16 (not shown) with a fast axis 20, a slow axis 18 and an emission axis 22 that is substantially perpendicular to the fast and slow axes 18 and 20. The emitters 16 are disposed in a substantially linear configuration along a slow axis direction 18 of the emitters 16. The laser emitter bars 12 of the stacked arrays 10 and 10' are stacked along a fast axis direction 20 of the emitters 16 with the emission axes 22 of the first stacked array 10 being disposed substantially parallel to the emission axes 22 of the second stacked array 10' and the fast axes 20 of the emitters 16 of the first stacked array 10 substantially aligned with the fast axes 20 of the emitters 16 of the second stacked array 10'. The emitters 16 of the first and second stacked arrays 10 and 10' are configured to have a substantially uniform polarization orientation.

A first fast axis collimator 35, which may be a cylindrical lens array 26 as shown in FIG. 2, or any other suitable embodiment, is configured to collimate an output of the first stacked array 10 in a fast axis direction 20. A second fast axis collimator 36, which may be a cylindrical lens array 26, is configured to collimate an output of the second stacked array 10' in a fast axis direction 20. A vertical beam interleaver 38 has an input axis aligned with the emission axes of the laser emitters 16 of the first and second stacked arrays 10 and 10'. The vertical beam interleaver 38 is configured to translate an emission array 28 of the first stacked array 10 towards an emission array 28' of the second stacked array 10' in a fast axis direction 20 such that substantially fast axis collimated outputs of emitter bars 12 of the first stacked array 10 are disposed adjacent or between substantially fast axis collimated outputs of emitter bars 12 of the second stacked array 10' in a vertically interleaved arrangement.

A beam combiner 40 has an input axis aligned with an output axis of the vertical beam interleaver 38 and is configured to fold the interleaved emission array 42 of the first and second stacked arrays 10 and 10' in a fast axis direction 20 as shown so as to reduce the overall beam size and increase the overall beam intensity. Focusing optics 44 are aligned with an output axis of the beam combiner 40 and serve to focus a light energy output 46 of the beam combiner 40 into an input surface of optical fiber 34. The beam combiner 40 may also be rotated 90 degrees and serve to fold the interleaved emission array 42 of the first and second stacked arrays 10 and 10' in a slow axis direction so as to reduce the overall beam size and increase the overall beam intensity.

The optical apparatus embodiment 32 shown also includes an optional first slow axis collimator 48 and second slow axis collimator 50, each of which may be an array of lenses, which serve to substantially collimate the output of the first stacked array 10 and second stacked array 10' respectively, in the slow axis direction 18. The optical apparatus 32 may also include an optional first wavelength control element 52 and second wavelength control element 54 in order to narrow a spectral band of the output of the first stacked array 10 and second stacked array 10'. Some embodiments of the wavelength control elements 52 and 54 may include volume index gratings (VIGs) which may also be known as volume Bragg gratings (VBGs), volume holographic gratings (VHGs) or any other suitable device.

In use, a first output array 28 of light energy and a second output array of light energy 28' are emitted from the stacked arrays of laser emitter bars 10 and 10' respectively. The first output array of light energy 28 and the second output array of light energy 28' are then vertically interleaved in a fast axis direction 20 by passing the output arrays 28 and 28' through the vertical beam interleaver 38. For the embodiment shown, the first output array 28 is translated in a fast axis direction by the vertical beam interleaver 38. The magnitude of the translation is configured such that substantially fast axis collimated outputs 28 of emitter bars 12 of the first stacked array 10 are disposed adjacent or between substantially fast axis collimated outputs 28' of the second stacked array 10' while maintaining the relative parallel character of the outputs. The vertically interleaved arrangement of outputs 28 and 28' are indicated by output array 42. A similar result may be achieved by translation in a fast axis direction of the first output array 28, the second output array 28' or both the first output array 28 and second output array 28'. The vertically interleaved first and second output arrays 42 are then passed through the beam combiner 40 and folded so as to reduce the transverse sectional area of the interleaved beam to increase the intensity and reduce the overall beam size. An output beam of the beam combiner 40 is focused into an input of an optical fiber 34 by focusing optics 44.

Figure 5:
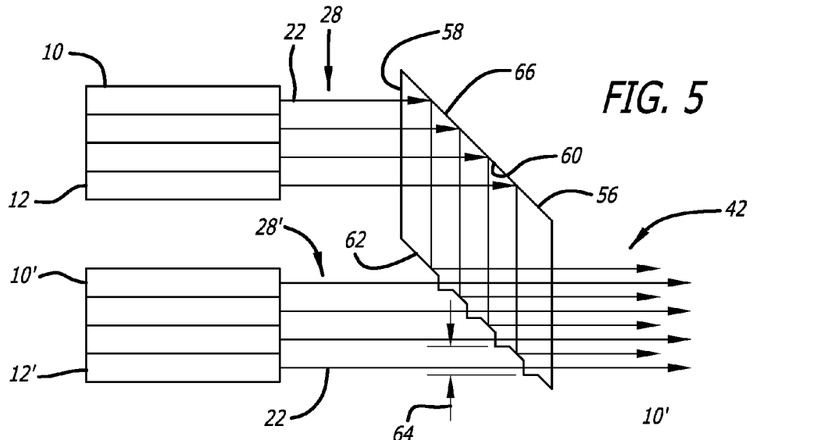
FIG. 5 is a side view of two stacked arrays of laser emitter bars emitting light energy into an input of the vertical beam interleaver embodiment.
Figure 6:
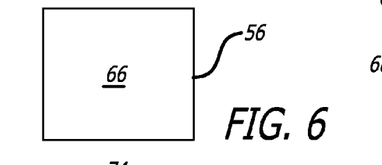
FIG. 6 is a top view of the vertical beam interleaver of FIG. 5.
Figure 7:
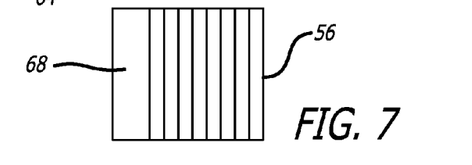
FIG. 7 is a bottom view of the vertical beam interleaver of FIG. 5.

FIGS. 5-7 illustrate an embodiment of a vertical beam interleaver 56 optically coupled to the first stacked array 10 of laser emitter bars 12 and the second stacked array 10' of laser emitter bars 12. An input axis of the vertical beam interleaver 56 is aligned with output axes of the first and second stacked arrays 10 and 10'. The vertical beam interleaver has a first input surface 58 and a first reflective surface 60 which are both disposed in front of and aligned with the emission axes 22 of the emitters 16 of the first stacked array 10. The first reflective surface 60 is oriented so as to direct reflected light energy from the first stacked array 10 to a second reflective surface 62 which is disposed facing and parallel to the first reflective surface 60. The second reflective surface 62 is also disposed in front of and aligned with the emission axes 22 of the emitters 16 of the second stacked array 10'. The second reflective surface 62 also includes a series of angled strips 64 disposed on the second reflective surface 62 along a slow axis direction 18 of the emitters 16 having a pitch indicated by arrow 64 that matches a pitch of the second stacked array indicated in FIG. 1 by arrow 24. The angled strips are shaped sections of refractive material of the vertical beam interleaver 56 which are configured to present a substantially perpendicular transmissive surface to oncoming output beams from the second stacked array 10' and be spaced between areas of incidence of output beams from the first stacked array 10 which have been reflected from the first reflective surface 60. A top surface 66 of the vertical beam interleaver 56 is shown in FIG. 6 and a bottom surface 68 of the vertical beam interleaver is shown in FIG. 7. This configuration produces a vertically interleaved output array 42 from the output arrays 28 and 28' with the output beams from the laser emitter bars 12 of the first stacked array 10 disposed between or adjacent to the output beams of the laser emitter bars of the second stacked array 10'. This configuration may also produce a vertically interleaved output array 42 from the output arrays 28 and 28' with the output beams from the laser emitter bars 12 of the first stacked array 10 disposed between and adjacent to the output beams of the laser emitter bars of the second stacked array 10'. As discussed above, the output characteristics of stacked arrays 10 and 10' may also be achieved by using different sections of a single stacked array having a similar configuration and the vertical interleaver 56 will function in essentially the same manner as discussed above.

Figure 8:
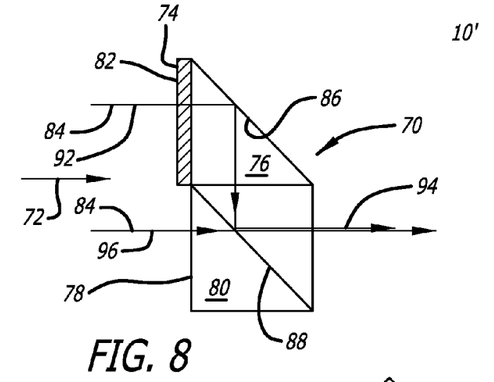
FIGS. 8-10 illustrate embodiments of beam combiners.

Once the output arrays 28 and 28' of the first and second stacked arrays 10 and 10' have been interleaved, the interleaved output arrays 42 may then be directed into an input axis of the beam combiner 40 in order to fold the interleaved output arrays 42. The spatial folding or superposition of the output beams facilitates subsequent condensing or focusing of the output beams into the input surface of optical conduit by focusing optics. FIG. 8 shows an embodiment of a beam combiner 40 that is a polarization beam combiner 70 having an input axis 72, a first input surface 74 on a first prism body 76 and a second input surface 78 on a second prism body 80. A polarization altering element 82 in the form of a half wave plate is disposed over the first input surface 74 which alters the polarization of the output beams 84 incident thereon such as by rotation of the polarization orientation of the incident light energy beams 84. A first reflective surface 86 is disposed parallel to a second selectively reflective surface 88 and is positioned behind the first input surface 74 and oriented so as to reflect light energy having passed through the first input surface 74 and the polarization altering element 82 onto the second selectively reflective surface 88. The second selectively reflective surface 88 is positioned behind the second input surface 78 such that light energy incident on the second input surface 78 propagating in the direction of the input axis 72 of the polarization beam combiner 70 will contact the second selectively reflective surface 88. The second selectively reflective surface 88 is configured to transmit light energy having a first polarization orientation and reflect light energy having a second polarization orientation which is different from the first polarization orientation.

In use, a first portion 92 of the interleaved first and second output arrays 42 having a first polarization orientation is passed through the polarization altering element 82 so as to generate a second polarization orientation for the first portion 92 of the interleaved first and second arrays 42. The first portion 92 of the interleaved first and second output arrays 42 is then reflected from the first reflective surface 86 to the second selectively reflective surface 88 which is parallel to the first reflective surface 86. The first portion 92 is then reflected from the second selectively reflective surface 88 and is emitted from the polarization beam combiner 70 along an output axis 94 of the polarization beam combiner 70. A second portion 96 of the interleaved first and second output arrays 42 having the first polarization orientation is passed through the second input surface 78 and then the second selectively reflective surface 88. The second portion 96 of the interleaved first and second output arrays 42 is then emitted from the polarization beam combiner 70 along the output axis 94 of the polarization beam combiner 70 parallel to the first portion.

For some embodiments (not shown), the polarization altering element 82 may be disposed over the second input surface 78. For these embodiments, the first portion 92 of the interleaved first and second output arrays 42 having a first polarization orientation passes through the first input surface 74 and is then reflected from the first reflective surface 74 towards the second selectively reflective surface 88. The selectively reflective surface 88 is configured to reflect light energy having the first polarization orientation and transmit light energy having a second polarization orientation. Thus, the first portion 92 is then reflected by second selectively reflective surface 88, which is parallel to the first reflective surface 74, and is emitted from the polarization beam combiner along an output axis of the polarization beam combiner. A second portion 96 of the interleaved first and second output arrays 42 having the first polarization orientation is passed through the polarization altering element 82 so as to generate a second polarization orientation for the second portion 96. The second portion 96 of the interleaved first and second output arrays 42 then passes through the second selectively reflective surface 88 and is emitted from the polarization beam combiner along the output axis of the polarization beam combiner. A similar arrangement may also be used for polarization beam combiner embodiments 98 and 100 discussed below.

Figure 9:
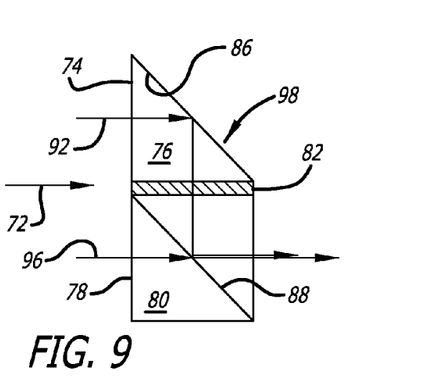

FIG. 9 shows an embodiment of a polarization beam combiner 98 having a configuration that is similar in some respects to the configuration of the polarization beam combiner 70 shown in FIG. 8. Polarization beam combiner 98 has a first input surface 74 on a first prism body 76 and a second input surface 78 on a second prism body 80 similar to the embodiment shown in FIG. 8. However, the polarization altering element 82 is disposed between the first and second prism bodies 76 and 80 and as shown in FIG. 9. The first reflective surface 86 is parallel to the second selectively reflective surface 88 with similar orientations with respect to the first and second input surfaces 74 and 78. The operation of the polarization beam combiner 98 is similar to that of the embodiment 70 of FIG. 8 except that the first portion 92 of the interleaved first and second output arrays 42 has the polarization altered or rotated after reflection from the first reflective surface 86.

Figure 10:
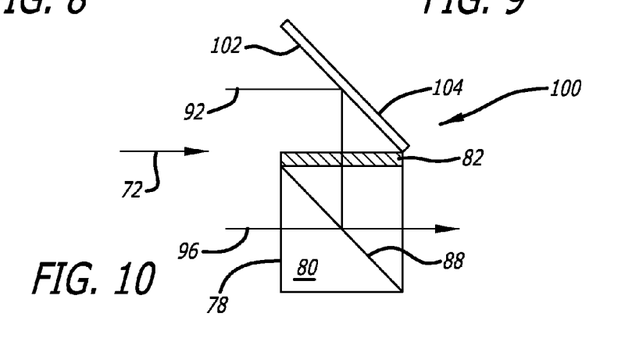

FIG. 10 shows an embodiment of a polarization beam combiner 100 that is similar to the beam polarization beam combiner 98 of FIG. 9 except that the first reflective surface 74 of the first prism body 76 has been replaced by a reflective surface 102 of a mirror element 104 which also serves as the first input surface 74. The reflective surface 102 is parallel to the second selectively reflective surface 88 of the second prism body. The polarization altering element 82 is disposed on top of the second prism body 80 between the second selectively reflective surface 88 and the reflective surface 102 of the mirror 104. The operation of the polarization beam combiner 100 is essentially the same as that of the polarization beam combiner embodiment 98 of FIG. 9. The polarization beam combiner embodiment 100 may also be modified as discussed above with regard to the embodiment of FIG. 8 wherein the polarization altering element 82 may be disposed in front of the second input surface 78 of the second prism body 80 or second selectively reflective surface 88 with appropriate adjustment to the configuration of the second selectively reflective surface 88 in order to achieve the beam combining effect.

Any of the above polarization beam combiner embodiments 70, 98 and 100 may also be used as wavelength combiners with some modification. The selectively reflective surface 88 for some wavelength beam combiner embodiments may be configured to reflect light energy of a second wavelength and transmit light energy of a first wavelength different from the first or vice versa. There are a variety of suitable methods for generating light energy of a first wavelength and second wavelength different from the first wavelength from the output of different portions of a single stacked array of laser emitter bars 12 or two or more separate stacked arrays of laser emitter bars 12. In some embodiments two or more stacked arrays or portions of a single stacked array may have differing laser emitter configurations which generate light energy of differing wavelengths. In other embodiments where all emitters of a stacked array or arrays are configured to generate light energy of substantially the same wavelength, a portion or portions of the output may be passed through a wavelength control element such as a VIG to produce light energy of differing wavelengths.

For some embodiments, folding the vertically interleaved first and second output arrays 42 includes passing the vertically interleaved first and second output arrays through such a wavelength beam combiner. More specifically, the first portion 92 of the vertically interleaved first and second output arrays 42 having a first wavelength band is passed through a first input surface and wavelength control element so as to generate a second wavelength band. The first portion 92 of the interleaved first and second output arrays 42 is then reflected from a first reflective surface towards the second selectively reflective surface which is parallel to the first reflective surface. The second portion 96 of the interleaved first and second output arrays 42 having the first wavelength band is passed through a second input surface and the second selectively reflective surface.

For some embodiments, the first portion 92 of the interleaved first and second output arrays 42 having a first wavelength band passes through a first input surface to a first reflective surface of a wavelength beam combiner. The first portion 92 is reflected from the first reflective surface towards a second selectively reflective surface which is parallel to the first reflective surface. The second selectively reflective surface is configured to reflect light energy having the first wavelength band and transmit light energy having a second wavelength band. As such, the first portion 92 is reflected from the second selectively reflective surface and is emitted from the wavelength beam combiner along an output axis of the wavelength beam combiner. The second portion 96 of the interleaved first and second output arrays 42 having the first wavelength band is passed through a wavelength control element so as to generate a second wavelength band. The second portion of the interleaved first and second output arrays is then passed through a second input surface and then through the second selectively reflective surface. The second portion 96 is then emitted from the wavelength beam combiner along the output axis of the wavelength beam combiner parallel to the first portion 92 of the interleaved first and second output arrays 42. For some embodiments where the laser emitters of respective stacked arrays or portions of a single stacked array are configured to generate light energy of differing wavelengths, the wavelength control element discussed above may not be required. Otherwise, for such embodiments, the operation of the wavelength beam combiner would be the same.

FIGS. 11-14 illustrate an embodiment of an optical apparatus 110 for coupling the light energy output of emitters 16 of laser emitter bars 12 of a first stacked array 10 and a second stacked array 10' into a fiber optic 34. The laser emitter bars of the second stacked array 10' are stacked along a fast axis direction of the emitters 16 with the emission axes of the first stacked array 10 being disposed substantially parallel to the emission axes of the second stacked array 10'. The slow axes 18 of the emitters 16 of the first stacked array 10 are substantially aligned with the slow axes 18 of the emitters 16 of the second stacked array 10' but with the first stacked array 10 displaced in a fast axis direction relative to the second stacked array 10' by about one half of the pitch 24 of the first stacked array 10. The emitters 16 of the first and second stacked arrays 10 and 10' have a substantially uniform polarization orientation. A first fast axis collimator 35 is configured to collimate an output of the first stacked array 10 in a fast axis direction.

Figure 11:
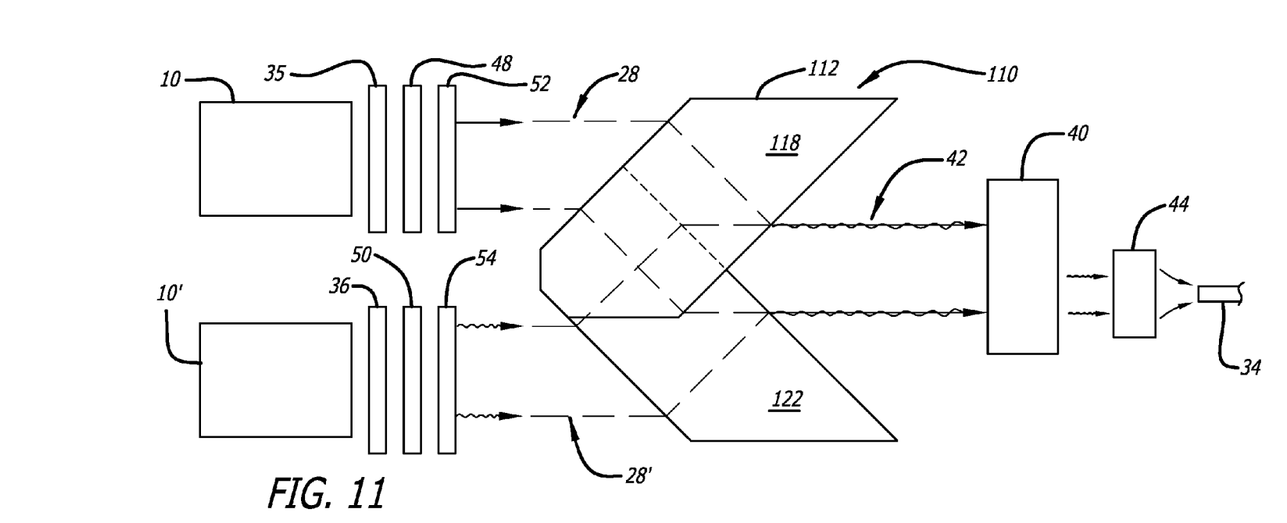
FIG. 11 is a top view of an optical apparatus for coupling light energy output of stacked laser emitter bar arrays including a lateral beam interleaver.
Figure 12:
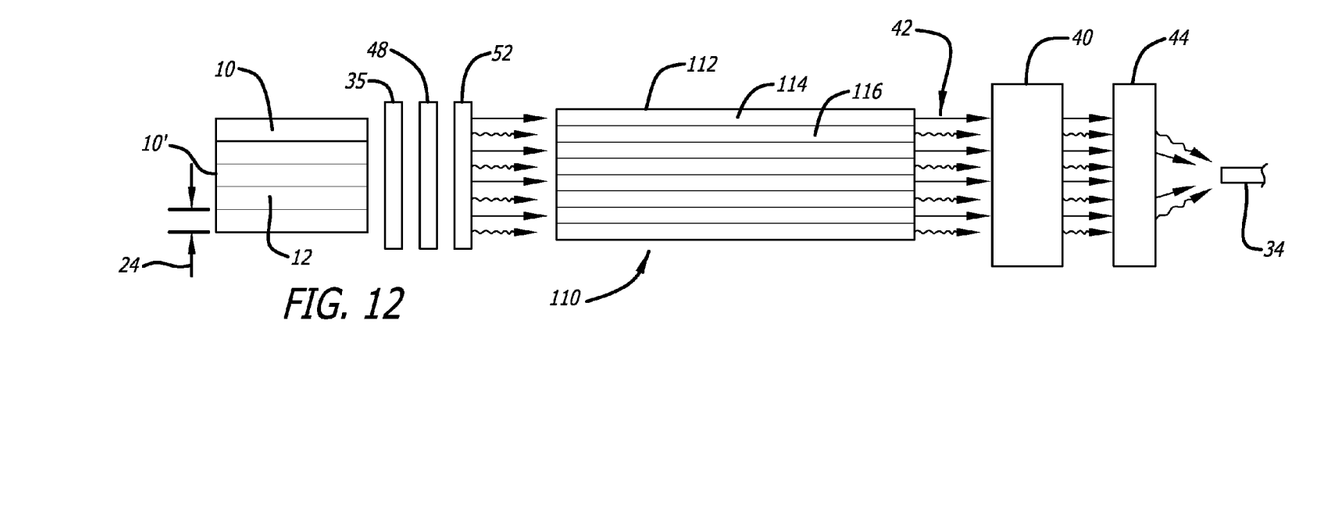
FIG. 12 is a side view of the optical apparatus of FIG. 11.

A second fast axis collimator 36 is configured to collimate an output of the second stacked array 10' in a fast axis direction. The fast axis collimators 35 and 36 may be a cylindrical lens array 26 as discussed above.

Figure 13:
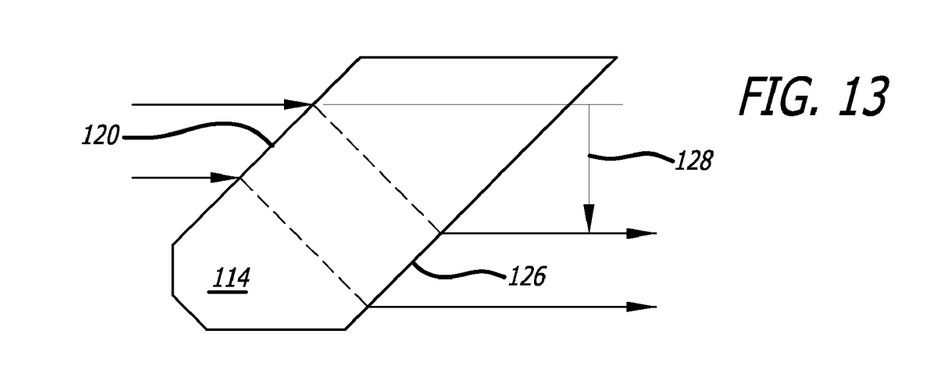
FIG. 13 illustrates an embodiment of a lateral beam interleaver element.
Figure 14:
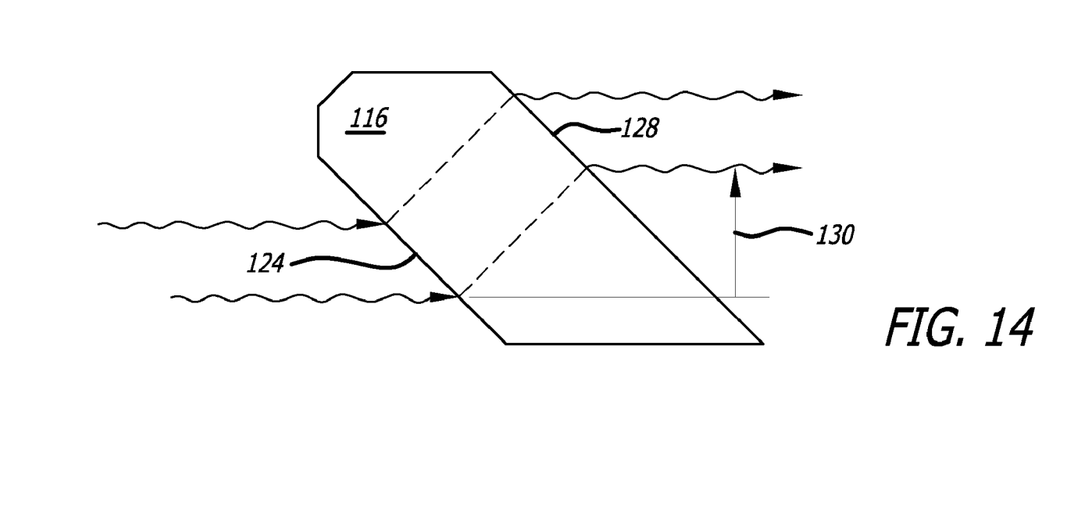
FIG. 14 illustrates an embodiment of a lateral beam interleaver element.

A lateral beam interleaver 112 has an input axis aligned with the emission axes of the laser emitters 16 of the first and second stacked arrays 10 and 10'. The lateral beam interleaver 112 is configured to translate an emission array 28 of the first stacked array 10 towards an emission array 28' of the second stacked array 10' in the slow axis direction 18. The lateral beam interleaver 112 is also configured to translate the emission array 28' in a slow axis direction towards the emission array 28. The translation process of both emission arrays 28 and 28' is carried out while maintaining the relative parallel propagation character of the emission arrays 28 and 28'. In addition, the relative translation process is carried out such that substantially fast axis collimated outputs of emitter bars 12 of the first stacked array 10 are disposed adjacent and between substantially fast axis collimated outputs of emitter bars 12 of the second stacked array 10' with the fast axes of the emitters 16 of the first stacked array 10 substantially aligned with the fast axes of the emitters 16 of the second stacked array 10' in a vertically interleaved arrangement. The lateral beam interleaver 112 includes a plurality of first lateral beam interleaver elements 114 and second lateral beam interleaver elements 116 as shown in FIGS. 13 and 14. Each lateral beam interleaver element 114 and 116 has an input surface and an output surface parallel to the input surface.

A set 118 of first lateral beam interleaver elements 114 has an input surface 120 of each element 114 disposed within an optical path of a corresponding laser emitter bar of the first stacked array 10. The set 118 of first lateral beam interleaver elements 114 is oriented at an angle with respect to the optical path so as to laterally translate the light energy output of the first stacked array 10 in a direction towards the second stacked array 10'. A set 122 of second lateral beam interleaver elements 116 has the input surface 124 of each element 116 disposed within an optical path of a corresponding laser emitter bar 12 of the second stacked arrays 10'. The set 122 of second lateral beam interleaver elements 116 is oriented at an angle with respect to the optical path so as to laterally translate the light energy output of the second stacked array 10' in a direction towards the first stacked array 10. The lateral beam interleaver elements 114 and 116 may have a width and angular orientation to produce a mutual lateral translation sufficient to vertically interleave the output arrays 28 and 28' of the first and second stacked arrays 10 and 10', respectively. FIG. 13 shows light energy output from a laser emitter bar 12 of the first stacked array 10 passing through the input surface 120 of the first lateral beam interleaver element 114 and the resulting lateral translation of the beam as indicated by arrow 128. FIG. 14 shows light energy output from a laser emitter bar 12 of the second stacked array 10' passing through the input surface 124 of the lateral beam interleaver element 116 and the resulting lateral translation of the beam by way of refraction as indicated by arrow 130, which is in the opposite direction as arrow 128 of the embodiment of FIG. 13. The lateral beam interleaver 112 may be configured to laterally translate the output array 28, the output array 28' or both the output array 28 and 28'. Some embodiments of lateral beam interleavers are discussed in commonly owned U.S. Pat. No. 6,516,011, filed Nov. 8, 2000 by H. Treusch, titled "Focusing Multiple Laser Beams", which is hereby incorporated by reference in its entirety.

A beam combiner 40, which may include any of the polarization or wavelength beam combiner embodiments 70, 98 and 100 discussed above, has an input axis aligned with an output axis of the lateral beam interleaver 112. The beam combiner 40 is configured to fold the interleaved emission arrays 42 of the first and second stacked arrays 10 and 10' in a slow axis direction so as to reduce the overall beam size and increase the overall beam intensity. Focusing optics 44 are aligned with an output axis of the beam combiner 40 and with an input surface of optical fiber 34.

The optical apparatus embodiment 112 shown also includes an optional first slow axis collimator 48 and second slow axis collimator 50, each of which may be an array or arrays of lenses, which serve to substantially collimate the output of the first stacked array 10 and second stacked array 10' respectively, in the slow axis direction 18. The optical apparatus may also include an optional first wavelength control element 52 and second wavelength control element 54 in order to narrow a spectral band of the output of the first stacked array 10 and second stacked array 10'. Some embodiments of the wavelength control elements 52 and 54 may include volume index gratings (VIGs) or any other suitable device.

In use, a first output array 28 of light energy and a second output array of light energy 28' are emitted from the stacked arrays of laser emitter bars 10 and 10'. The first output array of light energy 28 and the second output array of light energy 28' are then translated in a slow axis direction 18 by passing the output arrays 28 and 28' through the lateral beam interleaver 112 so as to vertically interleave the output arrays. The interleaved first and second output arrays 42 are then passed through the beam combiner 40 and folded so as to reduce the transverse sectional area of the interleaved beam to increase the intensity and reduce the overall beam size.

For some polarization beam combining embodiments, such as polarization beam combiner 70, a first portion 92 of the interleaved first and second output arrays 42 having a first polarization orientation is passed through the polarization altering element 82 so as to generate a second polarization orientation for the first portion 92 of the interleaved first and second arrays 42. The first portion 92 of the interleaved first and second output arrays 42 is then reflected from the first reflective surface 86 to the second selectively reflective surface 88 which is parallel to the first reflective surface 86. The first portion 92 is then reflected from the second selectively reflective surface 88 and is emitted from the polarization beam combiner 70 along an output axis of the polarization beam combiner 70. The second portion 96 of the interleaved first and second output arrays 42 having the first polarization orientation is passed through the second input surface 78 and then the second selectively reflective surface 88. The second portion 96 of the interleaved first and second output arrays 42 is then emitted from the polarization beam combiner 70 along the output axis of the polarization beam combiner parallel to the first portion. An output beam of the polarization beam combiner 70 is focused into an input of an optical fiber 34 by focusing optics 44.

For some embodiments (not shown), as discussed above, the polarization altering element 82 may be disposed over the second input surface 78. For these embodiments, the first portion 92 of the interleaved first and second output arrays 42 having a first polarization orientation passes through the first input surface 74 and is then reflected from the first reflective surface 86 towards the second selectively reflective surface 88. The selectively reflective surface 88 is configured to reflect light energy having the first polarization orientation and transmit light energy having a second polarization orientation. Thus, the first portion 92 is then reflected by second selectively reflective surface 88, which is parallel to the first reflective surface 86, and is emitted from the polarization beam combiner 70 along an output axis of the polarization beam combiner 70. The second portion 96 of the interleaved first and second output arrays 42 having the first polarization orientation is passed through the polarization altering element 82 so as to generate a second polarization orientation for the second portion 96. The second portion 96 of the interleaved first and second output arrays 42 then passes through the second selectively reflective surface 88 and is emitted from the polarization beam combiner 70 along the output axis of the polarization beam combiner 70.

Figure 15:
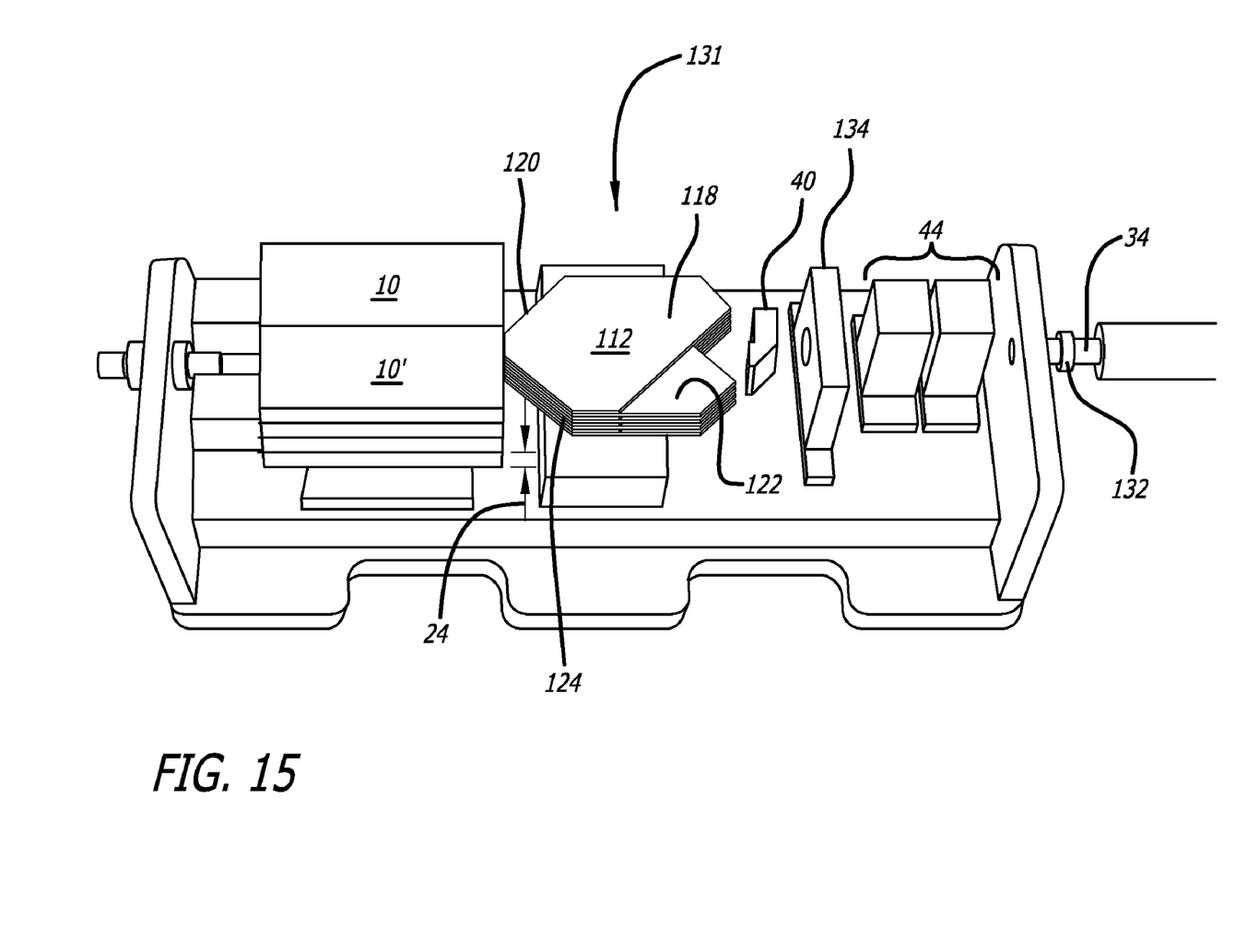
FIG. 15 is a perspective view of an embodiment of an optical apparatus for coupling an output of two stacked arrays of laser emitter bars into an optical fiber.

FIG. 15 is a perspective view of an embodiment of an optical apparatus 131 for coupling the light energy output of a first stacked array 10 of laser emitter bars 12 and a second stacked array 10' of laser emitter bars 12. The optical apparatus 131 may be similar to or the same as the optical apparatus 110 of FIGS. 11-14 in many respects and includes the first and second stacked arrays 10 and 10'. The laser emitter bars 12 of the second stacked array 10' are stacked along a fast axis direction of the emitters 16 with the emission axes 22 of the first stacked array 10 being disposed substantially parallel to the emission axes 22 of the second stacked array 10'. The slow axes 18 of the emitters 16 of the first stacked array 10 are substantially aligned with the slow axes 18 of the emitters 16 of the second stacked array 10' but with the first stacked array 10 displaced or offset in a fast axis direction relative to the second stacked array 10' by about one half of the pitch 24 of the first stacked array 10. The emitters 16 of the first and second stacked arrays 10 and 10' have a substantially uniform polarization orientation. A first fast axis collimator (not shown) may be configured to collimate an output of the first stacked array 10 in a fast axis direction. A second fast axis collimator (not show) may be configured to collimate an output of the second stacked array 10' in a fast axis direction.

A lateral beam interleaver 112 has an input axis aligned with the emission axes of the laser emitters 16 of the first and second stacked arrays 10 and 10' and is configured to translate an emission array 28 of the first stacked array 10 and an emission array 28' of the second stacked array 10' in the slow axis direction 18 towards each other as shown in FIGS. 11-14. The emission arrays 28 and 28' are thereby vertically interleaved such that substantially fast axis collimated outputs of emitter bars 12 of the first stacked array 10 are disposed adjacent and between substantially fast axis collimated outputs of emitter bars 12 of the second stacked array 10' with the fast axes of the emitters 16 of the first stacked array 10 substantially aligned with the fast axes of the emitters 16 of the second stacked array 10'. The lateral beam interleaver 112 includes a plurality of lateral beam interleaver elements 114 and 116 as shown in FIGS. 13 and 14.

A set 118 of first lateral beam interleaver elements 114 has the input surface 120 of each element 114 disposed within an optical path of a corresponding laser emitter bar 12 of the first stacked array 10. The set 118 of first lateral beam interleaver elements 114 is oriented at an angle with respect to the optical path so as to laterally translate the light energy output of the first stacked array 10 in a direction towards the second stacked array 10'. A set 122 of second lateral beam interleaver elements 116 has the input surface 124 of each element disposed within an optical path of a corresponding laser emitter bar 12 of the second stacked array 10'. The set 122 of second lateral beam interleaver elements 116 is oriented at an angle with respect to the optical path so as to laterally translate the light energy output of the second stacked array 10' in a direction towards the first stacked array 10. The lateral beam interleaver elements 114 and 116 may have a width and angular orientation to produce a mutual lateral translation sufficient to interleave the output arrays 28 and 28' of the first and second stacked arrays 10 and 10', respectively.

A beam combiner 40, which may include any of the polarization or wavelength beam combiner embodiments 70, 98 and 100 discussed above, has an input axis aligned with an output axis of the lateral beam interleaver 112. The beam combiner 40 is configured to fold the interleaved emission arrays of the first and second stacked arrays 42 in a slow axis direction 18 so as to reduce the overall beam size and increase the overall beam intensity. Focusing optics 44 are aligned with an output axis of the polarization beam combiner 40 and with an input surface of optical fiber 34. The focusing optics 44 may include a macro fast axis lens and a macro slow axis lens in order to achieve focusing on both the fast and slow axes. An optical fiber interface housing 132 that surrounds the optical fiber input may optionally be water cooled. An adjustable aperture or other suitable beam clipping device 134 may be included in the optical train of the apparatus 131 in order to shape or trim the profile of the light energy prior to focusing and coupling to fiber optic 34. The beam clipping device 134 may be placed in other positions or multiple beam clipping devices 134 may be placed in multiple positions in the optical train to shape or trim the beam size and numerical aperture before the beam including vertically interleaved arrays is coupled to fiber optic 34. These shaping and trimming processes may be used in order to limit the power of the light energy being coupled to a cladding of fiber optic 34. In addition, optics such as a telescope or telescopes (not shown) may be used in combination with beam clipping device 134 after the beam combiner 40 with the beam clipping device 134 disposed between lenses of the telescope in order to achieve the shaping and trimming functions. Telescopes such as 1:1 telescopes may be used for some of these embodiments.

The optical apparatus embodiment 131 shown also includes an optional first slow axis collimator 48 (not shown) and second slow axis collimator 50 (not shown) which serve to substantially collimate the output of the first stacked array 10 and second stacked array 10' respectively, in the slow axis direction 18. The optical apparatus may also include an optional first wavelength control element 52 (not shown) and second wavelength control element 54 (not shown) in order to narrow or otherwise control a spectral band of the output of the first stacked array 10 and second stacked array 10' respectively. Some embodiments of the wavelength control elements 52 and 54 may include VIGs or any other suitable devices. The operation of the optical apparatus may be the same as or similar to the operation of the optical apparatus discussed above and shown in FIGS. 11-14.

With regard to the above detailed description, like reference numerals used therein refer to like elements that may have the same or similar dimensions, materials and configurations. While particular forms of embodiments have been illustrated and described, it will be apparent that various modifications can be made without departing from the spirit and scope of the embodiments of the invention. Accordingly, it is not intended that the invention be limited by the forgoing detailed description.

What is claimed is:

1. An optical apparatus, comprising:
   at least one stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters with the emitters of the at least one stacked array having substantially parallel emission axes and a substantially uniform polarization orientation;

a fast axis collimator disposed adjacent the at least one stacked array and configured to collimate an output of the emitters of each laser emitter bar of the at least one stacked array in a fast axis direction;

a beam interleaver having an input axis aligned with the output axes of the laser emitters of the at least one stacked array of laser emitter bars and configured to interleave a first output array from a plurality of laser emitter bars and a second output array from a plurality of laser emitter bars such that substantially fast axis collimated outputs of emitter bars of the first output array are disposed adjacent or between substantially fast axis collimated outputs of emitter bars of the second output array with the fast axes of the emitters of the first output array substantially aligned with the fast axes of the emitters of the second output array;

a beam combiner having an input axis aligned with an output axis of the beam interleaver and configured to fold the vertically interleaved emission arrays of the first and second output arrays so as to reduce the overall beam size and increase the overall beam intensity; and focusing optics aligned with an output axis of the beam combiner.

2. The optical apparatus of claim 1 wherein the first and second output arrays are emitted from a single stacked array of laser emitter bars.

3. The optical apparatus of claim 1 wherein the first output array is emitted from a first stacked array of laser emitter bars and the second output array is emitted from a second stacked array of laser emitter bars.

4. The optical apparatus of claim 1 wherein the beam interleaver comprises a vertical beam interleaver configured to translate the first output array, the second output array or both the first and second output array in a fast axis direction.

5. The optical apparatus of claim 4 wherein the vertical beam interleaver comprises a reflective vertical beam interleaver.

6. The optical apparatus of claim 1 wherein the beam interleaver comprises a lateral beam interleaver configured to translate the first output array, the second output array or both the first and second output array in a slow axis direction.

7. The optical apparatus of claim 1 wherein the beam combiner comprises a polarization beam combiner.

8. The optical apparatus of claim 1 wherein the beam combiner comprises a wavelength beam combiner.

9. The optical apparatus of claim 1 further comprising a wavelength control element disposed in an optical train of the apparatus.

10. The optical apparatus of claim 9 wherein the wavelength control element comprises a VIG.

11. The optical apparatus of claim 1 further comprising a slow axis collimator disposed in an optical train of the apparatus.

12. The optical apparatus of claim 1 further comprising an optical fiber having an input axis aligned with an output axis of the focusing optics.

13. The optical apparatus of claim 1 wherein the fast axis collimator comprises an array of lenses.

14. A method of coupling light energy to an optical fiber, comprising:

emitting a first output array of light energy and a second output array of light energy from at least one stacked array of laser emitter bars;

vertically interleaving the first output array and the second output arrays of light energy with an interleaver;

folding the interleaved first and second output arrays with a beam combiner; and focusing an output beam of the beam combiner into an input of an optical fiber.

15. The method of claim 14 wherein emitting a first output array of light energy and a second output array of light energy comprises fast axis collimation of emitted light energy.

16. The method of claim 14 wherein emitting a first output array of light energy and a second output array of light energy comprises slow axis collimation of emitted light energy.

17. The method of claim 14 further comprising wavelength controlling at least one of the first and second output arrays.

18. The method of claim 14 wherein vertically interleaving the first and second output arrays of light energy comprises translating the first output array of light energy from a first stacked array, a second output array of light energy from a second stacked array or both the first output array and second output array in a generally slow axis direction.

19. The method of claim 14 wherein vertically interleaving the first and second output arrays of light energy comprises translating a first output array of light energy, a second output array of light energy or both the first output array and second output array in a generally fast axis direction.

20. The method of claim 14 wherein folding the vertically interleaved first and second output arrays comprises passing the vertically interleaved first and second output arrays through a polarization beam combiner.

21. The method of claim 20 wherein passing the vertically interleaved first and second output arrays through a polarization beam combiner comprises:

passing a first portion of the vertically interleaved first and second output arrays having a first polarization orientation through a polarization altering element so as to generate a second polarization orientation, reflecting the first portion of the vertically interleaved first and second output arrays from a first reflective surface and reflecting the first portion of the vertically interleaved first and second output arrays from a second selectively reflective surface which is parallel to the first reflective surface and configured to reflect light energy having the second polarization orientation and transmit light energy having the first polarization orientation; and passing a second portion of the vertically interleaved first and second output arrays having the first polarization orientation through the second selectively reflective surface.

22. The method of claim 20 wherein passing the vertically interleaved first and second output arrays through a polarization beam combiner comprises:

reflecting a first portion of the vertically interleaved first and second output arrays having a first polarization orientation from a first reflective surface and reflecting the first portion of the vertically interleaved first and second output arrays from a second selectively reflective surface which is parallel to the first reflective surface and configured to reflect light energy having the first polarization orientation and transmit light energy having a second polarization orientation; and passing a second portion of the vertically interleaved first and second output arrays having the first polarization orientation through a polarization altering element so as to generate a second polarization orientation and passing the second portion of the vertically interleaved first and second output arrays through the second selectively reflective surface.

23. The method of claim 14 wherein folding the vertically interleaved first and second output arrays comprises passing the interleaved first and second output arrays through a wavelength beam combiner.

24. The method of claim 23 wherein passing the vertically interleaved first and second output arrays through a wavelength beam combiner comprises:
passing a first portion of the vertically interleaved first and second output arrays having a first wavelength band through a wavelength altering element so as to generate a second wavelength band, reflecting the first portion of the interleaved first and second output arrays from a first reflective surface and reflecting the first portion of the interleaved first and second output arrays from a second selectively reflective surface which is parallel to the first reflective surface and configured to reflect light energy having the second wavelength band and transmit light energy having the first wavelength band; and
passing a second portion of the vertically interleaved first and second output arrays having the first wavelength band through the second selectively reflective surface.

25. The method of claim 23 wherein passing the vertically interleaved first and second output arrays through a wavelength beam combiner comprises:
reflecting a first portion of the vertically interleaved first and second output arrays having a first wavelength band from a first reflective surface and reflecting the first portion of the vertically interleaved first and second output arrays from a second selectively reflective surface which is parallel to the first reflective surface and configured to reflect light energy having the first wavelength band and transmit light energy having a second wavelength band; and
passing a second portion of the vertically interleaved first and second output arrays having the first wavelength band through a wavelength altering element so as to generate a second wavelength band and passing the second portion of the vertically interleaved first and second output arrays through the second selectively reflective surface.

26. The method of claim 23 wherein passing the vertically interleaved first and second output arrays through a wavelength beam combiner comprises:
reflecting the first portion of the interleaved first and second output arrays having a second wavelength band from a first reflective surface and reflecting the first portion of the interleaved first and second output arrays from a second selectively reflective surface which is parallel to the first reflective surface and configured to reflect light energy having the second wavelength band and transmit light energy having the first wavelength band; and
passing a second portion of the vertically interleaved first and second output arrays having the first wavelength band through the second selectively reflective surface.

27. The method of claim 14 wherein emitting a first output array of light energy and a second output array of light energy from at least one stacked array of laser emitter bars comprises emitting a first output array of light energy and a second output array of light energy from a single stacked array of laser emitter bars.

28. The method of claim 14 wherein emitting a first output array of light energy and a second output array of light energy from at least one stacked array of laser emitter bars comprises emitting a first output array from a first stacked array of laser emitter bars and emitting a second output array from a second stacked array of laser emitter bars.

29. An optical apparatus, comprising:
a first stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters;
a second stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters with the emission axes of the first stacked array being disposed substantially parallel to the emission axes of the second stacked array, the fast axes of the emitters of the first stacked array substantially aligned with the fast axes of the emitters of the second stacked array and the emitters of the first and second stacked arrays having a substantially uniform polarization orientation;
a first fast axis collimator configured to collimate an output of the first stacked array of laser emitter bars in a fast axis direction;
a second fast axis collimator configured to collimate an output of the second stacked array of laser emitter bars in a fast axis direction;
a vertical beam interleaver having an input axis aligned with the emission axes of the laser emitters of the first and second stacked arrays and configured to translate an emission array of the first stacked array, an emission array of the second stacked array or both the emission array of the first stacked array and the emission array of the second stacked array in a fast axis direction such that substantially fast axis collimated outputs of emitter bars of the first stacked array are disposed adjacent or between substantially fast axis collimated outputs of emitter bars of the second stacked array;
a beam combiner having an input axis aligned with an output axis of the vertical beam interleaver; and
focusing optics aligned with an output axis of the beam combiner.

30. The optical apparatus of claim 29 wherein the beam combiner comprises a polarization beam combiner.

31. The optical apparatus of claim 29 wherein the beam combiner comprises a wavelength beam combiner.

32. The optical apparatus of claim 29 further comprising a wavelength control element disposed in an optical train of the apparatus.

33. The optical apparatus of claim 32 wherein the wavelength control element comprises a VIG.

34. The optical apparatus of claim 29 further comprising at least one slow axis collimator disposed in an optical train of the apparatus.

35. The optical apparatus of claim 29 further comprising an optical fiber having an input axis aligned with an output axis of the focusing optics.

36. The optical apparatus of claim 29 wherein the first and second fast axis collimators comprise an array of lenses.

37. An optical apparatus, comprising:
a first stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters;

a second stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters with the emission axes of the first stacked array being disposed substantially parallel to the emission axes of the second stacked array, the slow axes of the emitters of the first stacked array substantially aligned with the slow axes of the emitters of the second stacked array with the first stacked array displaced in a fast axis direction relative to the second stacked array by about a one half a pitch of the first stacked array and the emitters of the first and second stacked arrays having a substantially uniform polarization orientation;

a first fast axis collimator configured to collimate an output of the first stacked array of laser emitter bars in a fast axis direction;

a second fast axis collimator configured to collimate an output of the second stacked array of laser emitter bars in a fast axis direction;

a lateral beam interleaver having an input axis aligned with the emission axes of the laser emitters of the first and second stacked arrays and configured to translate an emission array of the first stacked array, an emission array of the second stacked array or both the emission array of the first stacked array and the emission array of the second stacked array in the slow axis direction such that substantially fast axis collimated outputs of emitter bars of the first stacked array are disposed adjacent and between substantially fast axis collimated outputs of emitter bars of the second stacked array with the fast axes of the emitters of the first stacked array substantially aligned with the fast axes of the emitters of the second stacked array;

a beam combiner having an input axis aligned with an output axis of the lateral beam interleaver; and focusing optics aligned with an output axis of the beam combiner.

38. The optical apparatus of claim 37 wherein the beam combiner comprises a polarization beam combiner.

39. The optical apparatus of claim 37 wherein the beam combiner comprises a wavelength beam combiner.

40. The optical apparatus of claim 37 further comprising a wavelength control element disposed in an optical train of the apparatus.

41. The optical apparatus of claim 40 wherein the wavelength control element comprises a VIG.

42. The optical apparatus of claim 37 further comprising at least one slow axis collimator disposed in an optical train of the apparatus.

43. The optical apparatus of claim 37 further comprising an optical fiber having an input axis aligned with an output axis of the focusing optics.

44. The optical apparatus of claim 36 wherein the first and second fast axis collimators comprise an array of lenses.

45. An optical apparatus, comprising:

a first stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters;

a second stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters with the emission axes of the first stacked array being disposed substantially parallel to the emission axes of the second stacked array, the fast axes of the emitters of the first stacked array substantially aligned with the fast axes of the emitters of the second stacked array and the emitters of the first and second stacked arrays having a substantially uniform polarization orientation;

a first fast axis collimator configured to collimate an output of the first stacked array in a fast axis direction;

a second fast axis collimator configured to collimate an output of the second stacked array in a fast axis direction;

a vertical beam interleaver having an input axis aligned with the emission axes of the laser emitters of the first and second stacked arrays and configured to translate an emission array of the first stacked array, an emission array of the second stacked array or both the emission array of the first stacked array and the emission array of the second stacked array in a fast axis direction such that substantially fast axis collimated outputs of emitter bars of the first stacked array are disposed adjacent or between substantially fast axis collimated outputs of emitter bars of the second stacked array;

a polarization beam combiner having an input axis aligned with an output axis of the vertical beam interleaver and configured to fold the interleaved emission arrays of the first and second stacked arrays in a fast axis direction so as to reduce the overall beam size and increase the overall beam intensity; and focusing optics aligned with an output axis of the polarization beam combiner.

46. An optical apparatus, comprising:

a first stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters;

a second stacked array of laser emitter bars which each have a plurality of laser emitters with a fast axis, a slow axis and an emission axis that is substantially perpendicular to the fast and slow axes disposed in a substantially linear configuration along a slow axis direction of the emitters and which are stacked along a fast axis direction of the emitters with the emission axes of the first stacked array being disposed substantially parallel to the emission axes of the second stacked array, the slow axes of the emitters of the first stacked array substantially aligned with the slow axes of the emitters of the second stacked array with the first stacked array displaced in a fast axis direction relative to the second stacked array by about one half a pitch of the first stacked array and the emitters of the first and second stacked arrays having a substantially uniform polarization orientation;

a first fast axis collimator configured to collimate an output of the first stacked array in a fast axis direction;

a second fast axis collimator configured to collimate an output of the second stacked array in a fast axis direction;

a lateral beam interleaver having an input axis aligned with the emission axes of the laser emitters of the first and second stacked arrays and configured to translate an emission array of the first stacked array, an emission array of the second stacked array or both the emission array of the first stacked array and the emission array of the second stacked array in the slow axis direction such that substantially fast axis collimated outputs of emitter bars of the first stacked array are disposed adjacent and between substantially fast axis collimated outputs of emitter bars of the second stacked array with the fast axes of the emitters of the first stacked array substantially aligned with the fast axes of the emitters of the second stacked array;

a polarization beam combiner having an input axis aligned with an output axis of the lateral beam interleaver and configured to fold the interleaved emission arrays of the first and second stacked arrays in a slow axis direction so as to reduce the overall beam size and increase the overall beam intensity; and focusing optics aligned with an output axis of the polarization beam combiner.

* * * * *